US008268710B2

(12) United States Patent
Kwon et al.

(10) Patent No.: US 8,268,710 B2
(45) Date of Patent: Sep. 18, 2012

(54) METHOD FOR FABRICATING SEMICONDUCTOR DEVICES

(75) Inventors: Byoungho Kwon, Hwaseong-si (KR); Boun Yoon, Seoul (KR); Daeik Kim, Yongin-si (KR); Sung-Min Cho, Goyang-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 330 days.

(21) Appl. No.: 12/703,071

(22) Filed: Feb. 9, 2010

(65) Prior Publication Data
US 2010/0216293 A1 Aug. 26, 2010

(30) Foreign Application Priority Data
Feb. 23, 2009 (KR) .................. 10-2009-0014950

(51) Int. Cl.
*H01L 21/3205* (2006.01)
*H01L 21/4763* (2006.01)
*H01L 21/44* (2006.01)

(52) U.S. Cl. ........ 438/586; 438/629; 438/637; 438/675; 257/E21.577; 257/E21.586

(58) Field of Classification Search .................. 438/303, 438/571, 586, 597, 629, 637–640, 668, 672, 438/675
See application file for complete search history.

(56) References Cited

FOREIGN PATENT DOCUMENTS
| | | |
|---|---|---|
| JP | 2001-118845 | 4/2001 |
| KR | 10-2002-0036148 | 5/2002 |
| KR | 100772251 | 10/2007 |
| KR | 100791697 | 12/2007 |

OTHER PUBLICATIONS

English Abstract for Publication No. 2001-118845.
English Abstract for Publication No. 1020020036148.
English Abstract for Publication No. 100772251.
English Abstract for Publication No. 100791697.

*Primary Examiner* — Charles Garber
*Assistant Examiner* — Calvin Choi
(74) *Attorney, Agent, or Firm* — F. Chau & Associates, LLC

(57) ABSTRACT

A method for fabricating a semiconductor device includes providing a semiconductor substrate including a memory cell region and peripheral circuit regions. Gate electrodes including gate conductive patterns and capping patterns are formed on the memory cell region and the peripheral circuit regions. An interlayer dielectric covering the gate electrodes is formed. The interlayer dielectric is patterned to form first contact holes exposing the semiconductor substrate along side of the gate electrode in the memory cell region and second contact holes exposing a portion of the capping pattern in the peripheral circuit region such that a bottom surface of the second contact hole is spaced apart from a top surface of the gate conductive pattern. A first plug conductive layer is filled in the first contact holes and a second plug conductive layer is filled in the second contact holes. A planarizing process is performed to expose the capping patterns such that first contact plugs are formed in the memory cell region and second contact plugs are formed in the peripheral circuit region.

8 Claims, 10 Drawing Sheets

METHOD FOR FABRICATING SEMICONDUCTOR DEVICES

CROSS-REFERENCE TO RELATED APPLICATIONS

This patent application claims priority under 35 U.S.C. §119 from Korean Patent Application No. 10-2009-0014950, filed on Feb. 23, 2009, the contents of which are herein incorporated by reference in their entirety.

BACKGROUND

The present disclosure is directed to a method for fabricating a semiconductor device, and more particularly, to a method for fabricating a semiconductor device that can improve flatness.

With the increasing integration of semiconductor devices, contact plugs are formed to electrically connect interconnections alternatingly stacked with insulating layers in-between. The contact plugs may be formed by forming contact holes in the insulating layers, filling a conductive material in the contact holes and performing a planarizing process for electrical isolation between the contact plugs.

Then, the contact plugs may be formed on a semiconductor substrate having differing levels of integration for different respective regions. In other words, in a semiconductor device including a memory cell region and a peripheral circuit region, contact plugs may have a higher density in the memory cell region than in the peripheral circuit region.

Thus, in the case where the density of the contact plugs differs by region, flatness may differ by region due to the planarizing process that forms the contact plugs. That is, a height difference between predetermined regions may be generated.

SUMMARY

The present disclosure provides a method for fabricating a semiconductor device that can enhance flatness.

Embodiments of the inventive concept provide methods for fabricating a semiconductor device, including: providing a semiconductor substrate including a memory cell region and peripheral circuit regions; forming gate electrodes including gate conductive patterns and capping patterns on the memory cell region and the peripheral circuit regions; forming an interlayer dielectric covering the gate electrodes; patterning the interlayer dielectric to form first contact holes in the memory cell region exposing the semiconductor substrate along side of the gate electrode and second contact holes in the peripheral circuit region exposing a portion the capping pattern to space apart a bottom surface of the second contact hole from a top surface of the gate conductive pattern; filling a first plug conductive layer in the first contact holes and a second plug conductive layer in the second contact holes; and performing a planarizing process to expose the capping patterns and to form first contact plugs in the memory cell region and second contact plugs in the peripheral circuit region.

Other embodiments of the inventive concept provide methods for fabricating a semiconductor device, including: preparing a semiconductor substrate including a memory cell region, a dummy region, and peripheral circuit region; forming gate electrodes having gate conductive patterns and a capping pattern on the semiconductor substrate; forming impurity regions in the semiconductor substrate by using the gate electrodes as an ion implantation mask; forming a first interlayer dielectric covering the gate electrodes; patterning the first interlayer dielectric to form first contact holes in the memory cell region exposing the semiconductor substrate and the impurity regions, and second contact holes in the dummy and peripheral circuit regions exposing a portion of the capping patterns of the gate electrodes; filling a conductive layer on the top surface of the first interlayer dielectric and the first and second contact holes to form first and second plug conductive layers in the first and second contact holes, respectively; and planarizing the gate electrodes including a portion of the capping patterns and the first interlayer dielectric including the first and second plug conductive layers to form first contact plugs in the memory cell region and second contact plugs in the dummy region.

Particularities of other embodiments are included in the detailed description and drawings.

DETAILED DESCRIPTION OF EXEMPLARY EMBODIMENTS

Figure 1:
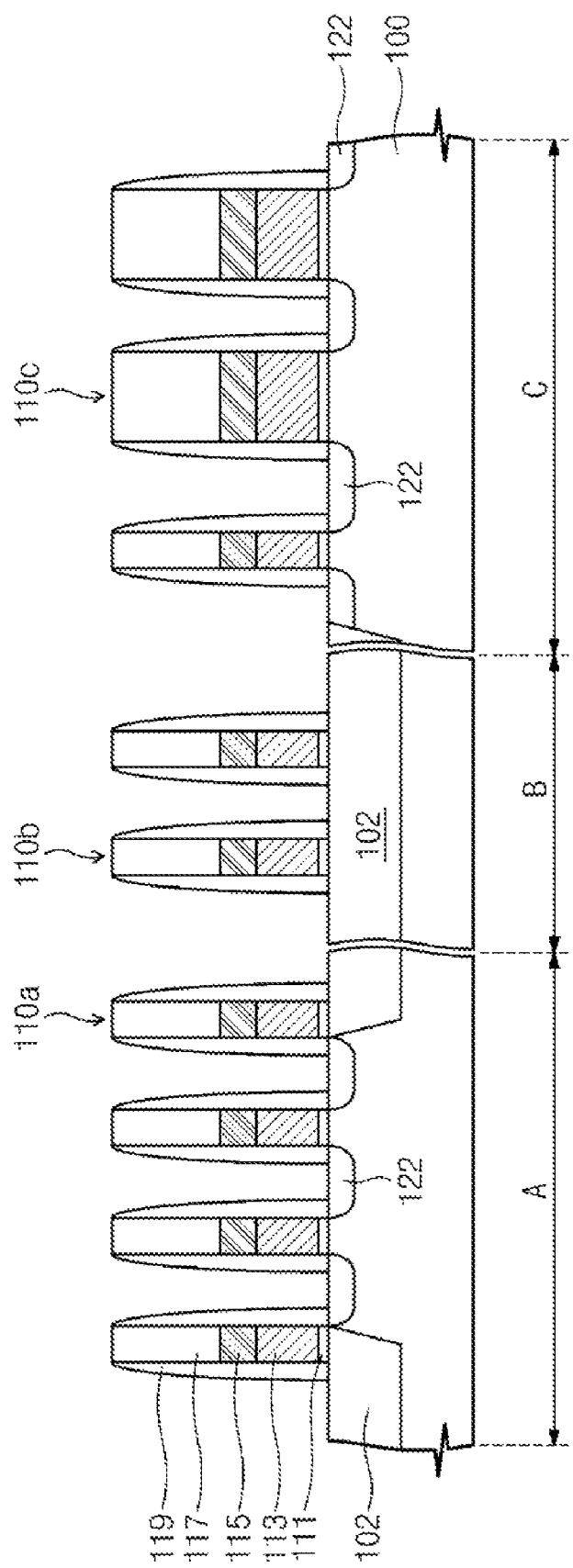
FIGS. 1 through 6 are cross-sectional views illustrating a method for fabricating a semiconductor device according to an embodiment of the inventive concept.

Exemplary embodiments of the inventive concept will be described below in more detail with reference to the accompanying drawings. The inventive concept may, however, be embodied in different forms and should not be construed as limited to the embodiments set forth herein. Throughout, like reference numerals refer to like elements throughout.

Hereinafter, a method for fabricating a semiconductor device according to embodiments of the inventive concept will be described in detail with the accompanying drawings.

FIGS. 1 through 6 are cross-sectional views illustrating a method for fabricating a semiconductor device according to an embodiment of the inventive concept.

Referring to FIG. 1, a semiconductor substrate 100 including a memory cell region A, a dummy region B and a peripheral circuit region C is prepared. Device isolation layers 102 defining an active region in the semiconductor substrate 100 are formed. The device isolation layers 102 may be formed, for example, by performing a shallow trench isolation (STI) process. As the device isolation layers 102 are formed, an active region may be defined in each of the memory cell region A and the peripheral circuit region C. Also, a dummy active region (not shown) may be defined in the dummy region B.

Gate electrodes 110a, 110b, 110c are formed on the semiconductor substrate 100 corresponding to the memory cell region A, the dummy region B and the peripheral circuit region C.

Specifically, the gate electrodes 110a, 110b, 110c are formed in a stacked structure in the order of a gate dielectric 111, gate conductive patterns 113, 115, and a capping pattern 117. Also, sidewall spacers 119 are formed on sidewalls of each of the gate dielectric 111, the gate conductive pattern 113, 115 and the capping pattern 117. The gate dielectric 111 may be formed from a thermal oxide layer, a chemical vapor deposition (CVD)-oxide layer, an atomic layer deposition (ALD)-oxide layer or a high-k dielectric layer. The gate conductive pattern 113, 115 may have a stack structure made of a polysilicon layer 113 and a silicide layer 115. Alternatively, the gate conductive pattern 113, 115 may be formed of a polysilicon layer or a metal layer. Also, the capping pattern 117 and the sidewall spacers 119 may be formed of SiN, SiC or BN.

When the gate electrodes 110a, 110b, 110c are formed, the gate electrodes 110a, 110b, 110c may be formed with differing levels of integration for different respective regions. In other words, a width of the gate electrodes 110a in the memory cell region A may be smaller than a width of the gate electrodes 110c in the peripheral circuit region C. Also, the spacing between the gate electrodes 110a in the memory cell region A may be smaller than the spacing between the gate electrodes 110c in the peripheral circuit region C.

After the gate electrodes 110a, 110b, 110c are formed on the semiconductor substrate 100, impurity regions 122 are formed in the semiconductor substrate 100 by using the gate electrodes 110a, 110b, 110c as an ion implantation mask.

Figure 2:
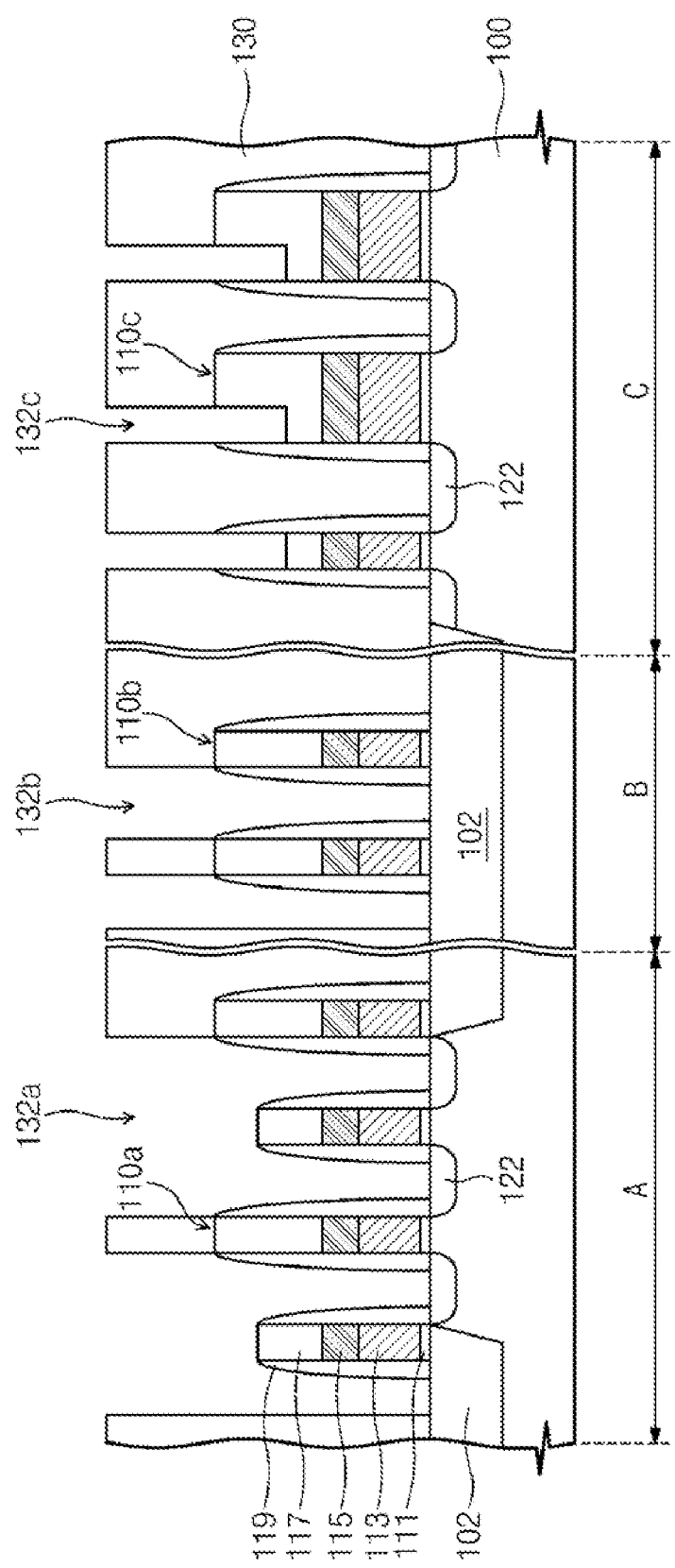

Referring to FIG. 2, a first interlayer dielectric 130 covering the gate electrodes 110a, 110b, 110c is formed. The first interlayer dielectric 130 may be formed by depositing a dielectric having a superior gap filling characteristic on the semiconductor substrate 100 and the gate electrodes 110a, 110b, 110c, and planarizing the top surface of the deposited first interlayer dielectric 130. The first interlayer dielectric 130 may be formed of silicon oxide, such as, BoroPhosphoSilicate Glass (BPSG), Plasma-Enhanced Tetra Ethyl Ortho Silicate (PE-TEOS) and High Density Plasma (HDP).

Thereafter, a photolithography process is performed on the first interlayer dielectric 130 to form first contact holes 132a in the memory cell region A and second contact holes 132b, 132c in the dummy region B and the peripheral circuit region C.

Specifically, the first contact holes 132a formed in the memory cell region A expose the impurity regions 122 along side the gate electrodes 110a. Also, since the gate electrodes 110a have a higher level of integration in the memory cell region A, one first contact hole 132a may simultaneously expose the impurity regions 122 on several sides of the gate electrode 110a. In this case, in forming the first contact hole 132a, the capping pattern 117 of the gate electrode 110a and the sidewall spacer 119 may be partially etched. As a result, the heights of the gate electrodes 110a in the memory cell region A may differ from each other.

The second contact holes 132b, 132c formed in the dummy region B and the peripheral circuit region C may expose the semiconductor substrate 100 on one side of the gate electrodes 110b and may expose a portion of the capping patterns 117 of the gate electrodes 110c. The second contact holes 132b, 132c formed in the dummy region B and the peripheral circuit region C are dummy contact holes for enhancing the reliability of the semiconductor manufacturing process. The second contact holes 132c formed at an upper portion of the gate electrodes 110c may have a shallower depth than the first contact holes 132a due to a difference in etch rate between the first interlayer dielectric 130 and the capping pattern 117. In addition, a bottom surface of the second contact holes 132c partially exposing the capping pattern 117 of the gate electrodes 110c may be spaced apart from the gate conductive pattern 115.

In forming the first and second contact holes 132a, 132b, 132c, the second contact holes 132b may have a different plan view from the first contact holes 132a. That is, the second contact holes 132b may have various plan views, such as a line form, a rectangular form or the like. According to an embodiment, to enhance flatness in the planarizing process, an area density of the first contact holes 132a in the memory cell region A may be substantially the same as an area density of the second contact holes 132b, 132c in the dummy region B and the peripheral circuit region C.

Figure 3:
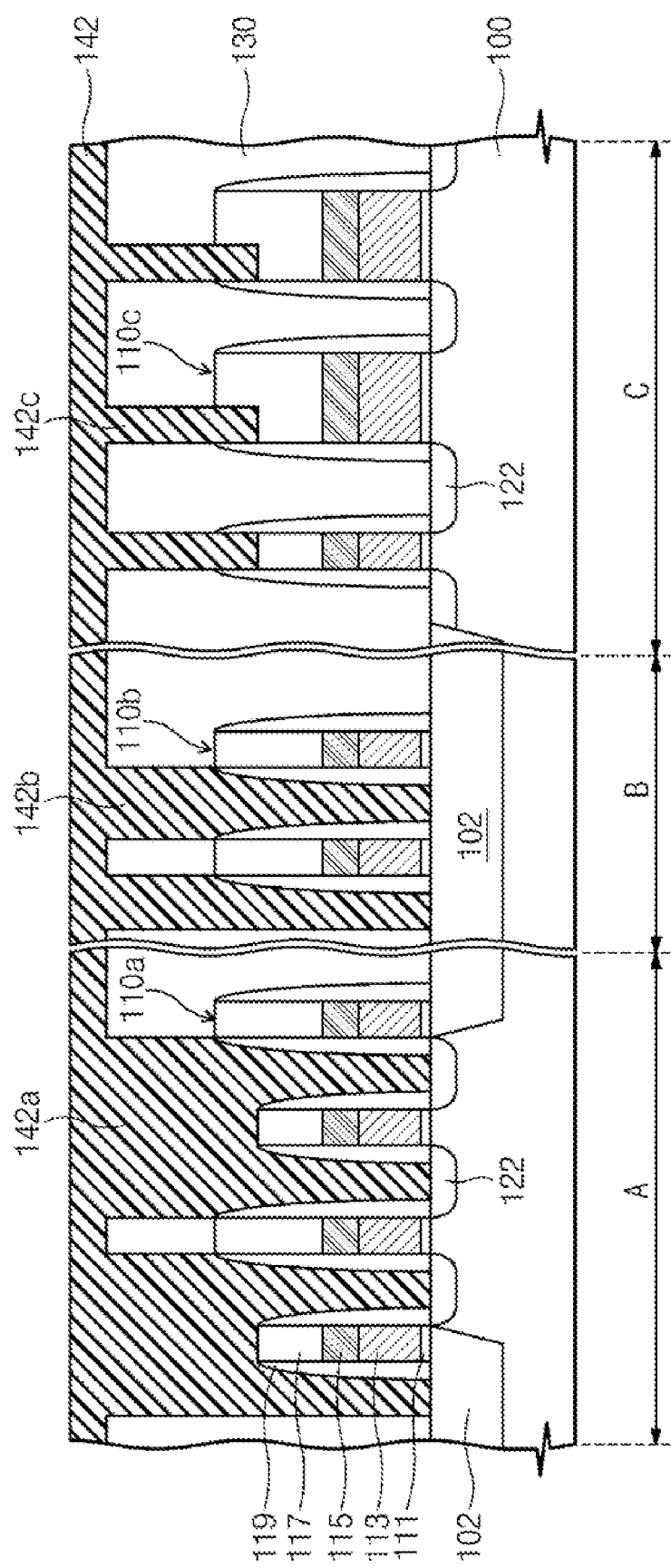

Referring to FIG. 3, a conductive layer 142 is filled in the first and second contact holes 132a, 132b, 132c. The conductive layer 142 may be formed by a deposition process to a thickness sufficient to cover the top surface of the first interlayer dielectric 130. As the first conductive layer 142 is deposited, first and second plug conductive layers 142a, 142b, 142c are formed in the first and second contact holes 132a, 132b, 132c, respectively.

In addition, the first plug conductive layer 142a may cover a top surface of the gate electrode 110a exposed in the first contact hole 132a. Accordingly, the first plug conductive layer 142a may contact the impurity regions 122 on several sides of the gate electrode 110a.

Next, a planarizing process is performed with respect to the gate electrodes 110a, 110b, 110c, and the first interlayer dielectric 130 including the first and second plug conductive layers 142a, 142b, 142c. The planarizing process may be a chemical mechanical polishing (CMP) process or a blanket etch process.

Figure 4:
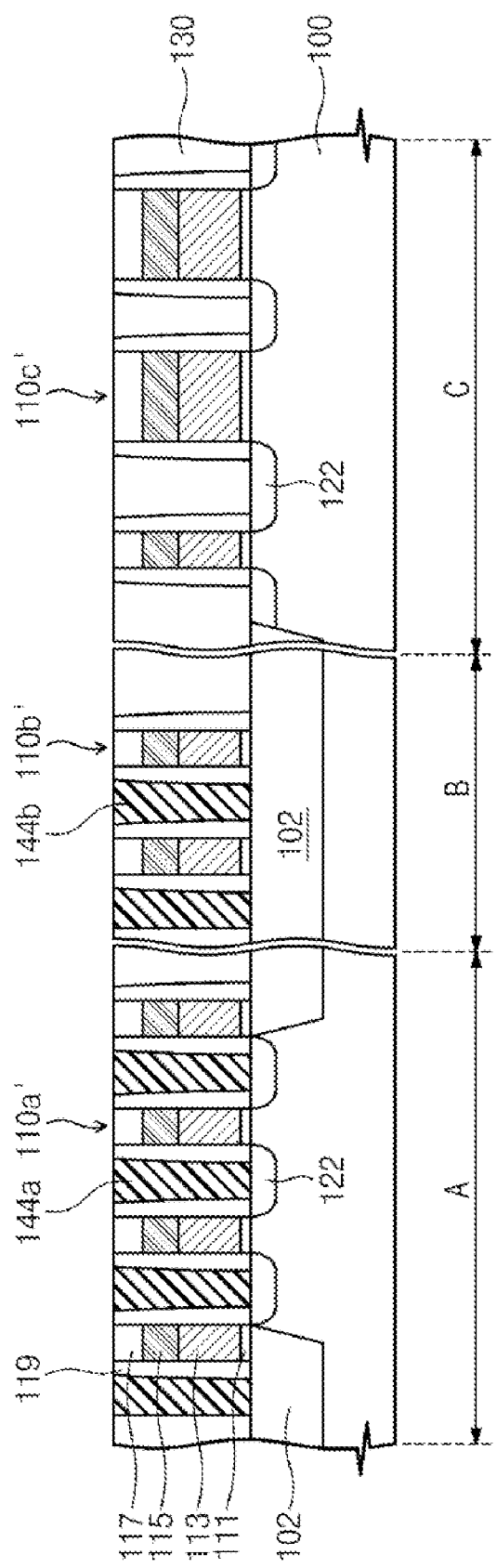

Referring to FIG. 4, through the planarizing process, first and second contact plugs 144a, 144b are formed in the memory cell region A and the dummy region B, respectively. According to embodiments of the inventive concept, the first contact plugs 144a are contact pads electrically connected with the impurity regions 122 of the memory cell region A, and the second contact plugs 144b are dummy contact plugs not having an electrical connection function in the semiconductor device.

In more detail, the first interlayer dielectric 130, the first and second plug conductive layers 142a, 142b, 142c and a portion of the capping patterns 117 are planarized such that the gate electrodes 110a, 110b, 110c have the same height in the memory cell region A, the dummy region B and the peripheral circuit region C. That is, in the memory cell region A, the planarizing process is performed until the capping pattern 117 of the gate electrode having a recessed upper portion is exposed. The planarizing process electrically separates the first contact plugs 144a from the second contact plugs 144b. In other words, the planarizing process exposes top surfaces of all the capping patterns 117 of the gate electrodes 110a', 110b', 110c' positioned on the semiconductor substrate 100. Accordingly, the capping patterns 117 left on the gate electrodes 110a', 110b', 110c' may have a uniform thickness. In addition, while the planarizing process is performed, the second plug conductive layers 142c on the gate electrode 110c' in the peripheral circuit region C are completely removed.

Since the area density of the first contact holes 132a is the same as that of the second contact holes 132b, 132c, generation of a height difference between the regions A, B and C after the planarizing process can be prevented. That is, flatness can be enhanced by the planarizing process. Also, by performing the planarizing process, the heights of the first interlayer dielectric 130 and the gate electrodes 110a', 110b', 110c' can be decreased.

Figure 5:
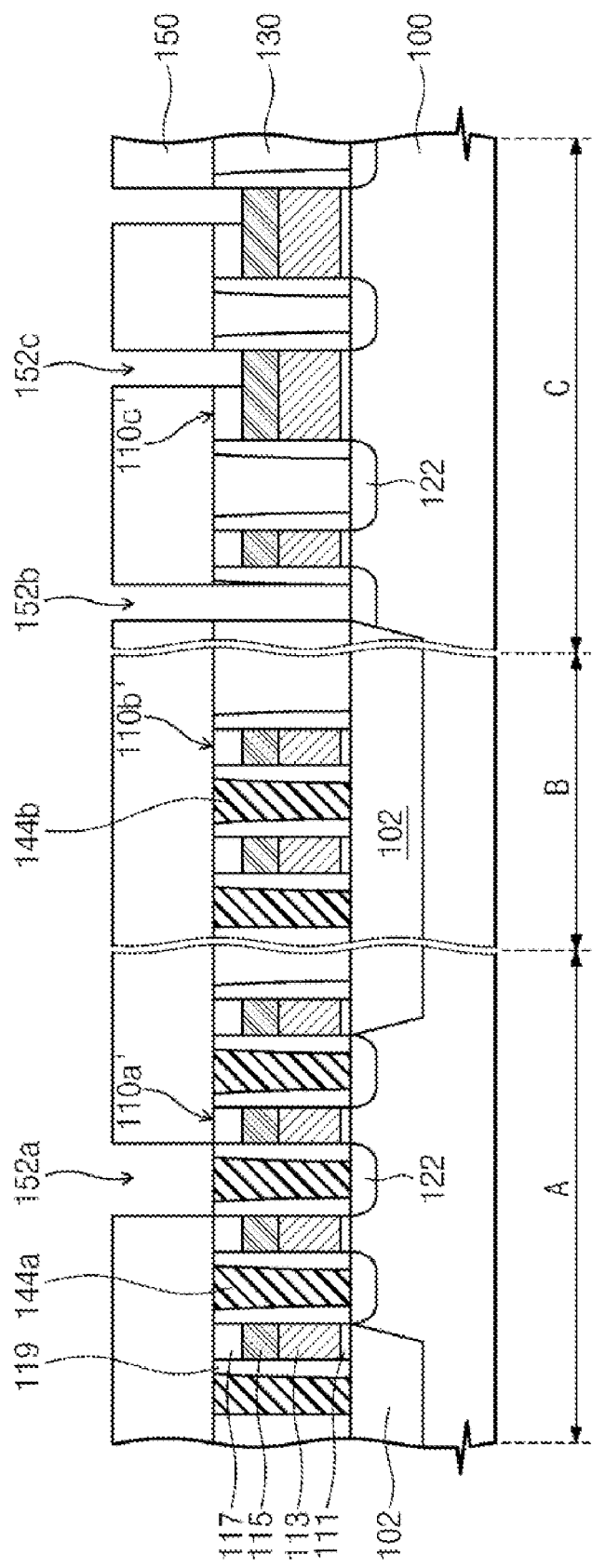

Referring to FIG. 5, a second interlayer dielectric 150 is formed on the first interlayer dielectric 130 including the gate electrodes 110a', 110b', 110c' and on the first and second contact plugs 144a and 144b. Since the second interlayer dielectric 150 is formed on a planarized surface, the second interlayer dielectric 150 may be formed with a uniform thickness.

Thereafter, a photolithography process is performed with respect to the second interlayer dielectric 150 to form third contact holes 152a in the memory cell region A and fourth contact holes 152b, 152c in the peripheral circuit region C. The third contact holes 152a may expose a top surface of the first contact plugs 144a in the memory cell region A, and the fourth contact holes 152b, 152c may expose the impurity regions 122 and/or the conductive patterns 115 of the gate electrode 110c' in the peripheral circuit region C.

The height of the first interlayer dielectric 130 is decreased through the planarizing process. Accordingly, by forming the fourth contact holes 152b exposing the impurity regions 122 in the peripheral circuit region C, it is possible to decrease the aspect ratio of the fourth contact holes 152b.

Figure 6:
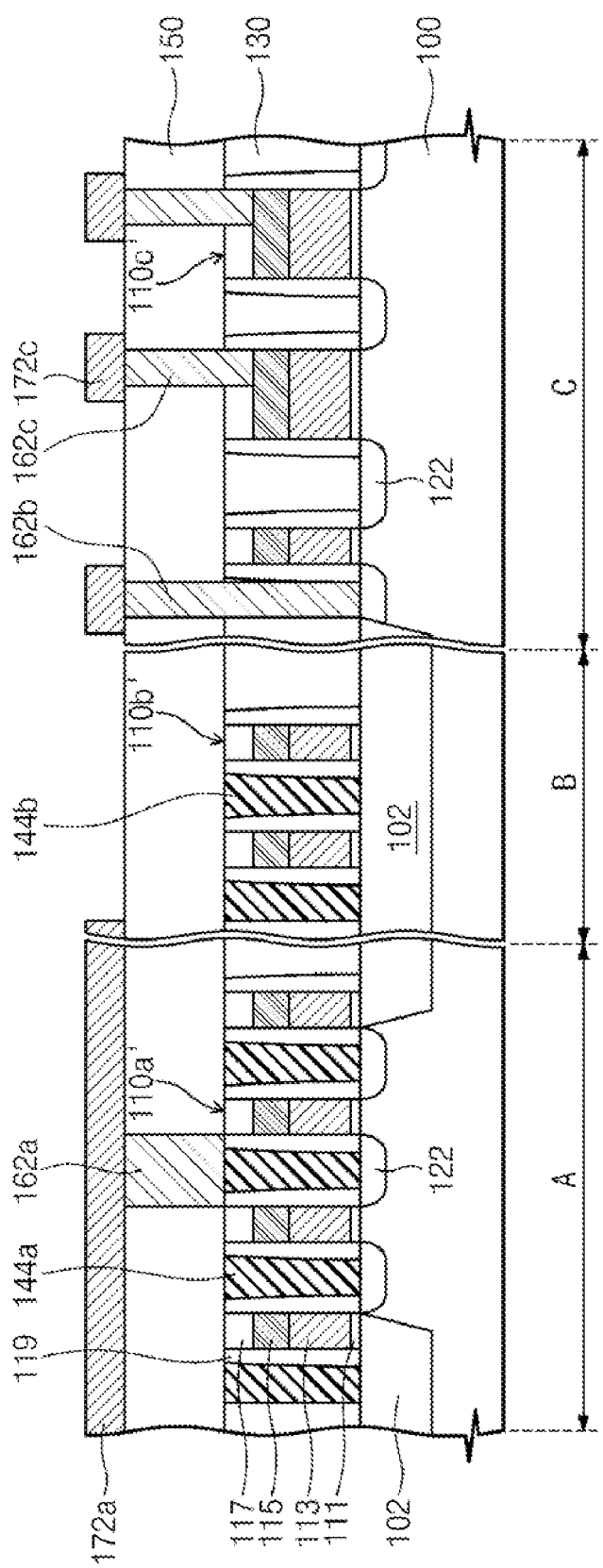

Referring to FIG. 6, a conductive material is filled in the third and fourth contact holes 152a, 152b, 152c to form third and fourth contact plugs 162a, 162b, 162c. That is, the third contact plugs 162a electrically connected with the first contact plug 144a are formed in the memory cell region A, and the fourth contact plugs 162b and 162c electrically connected with the gate electrode 110c' and/or the impurity region 122 are formed in the peripheral circuit region C. When the fourth contact plugs 162b and 162c are formed, since none of the second plug conductive layer (see 142c of FIG. 3) remains on the gate electrode 110c', the fourth contact plugs 162b and 162c can be prevented from unintentionally electrically connecting with the second plug conductive layer (see 142c of FIG. 3).

Thereafter, an interconnection 172a may be formed on the third contact plug 162a in the memory cell region A and interconnections, 172c may be formed on the fourth contact plugs 162b, 162c in the peripheral circuit region C. The interconnections 172a, 172c may be bit lines. In addition, the gate electrodes 110b and the second contact plugs 144b in the dummy region B are electrically separated from other elements.

Figure 7:
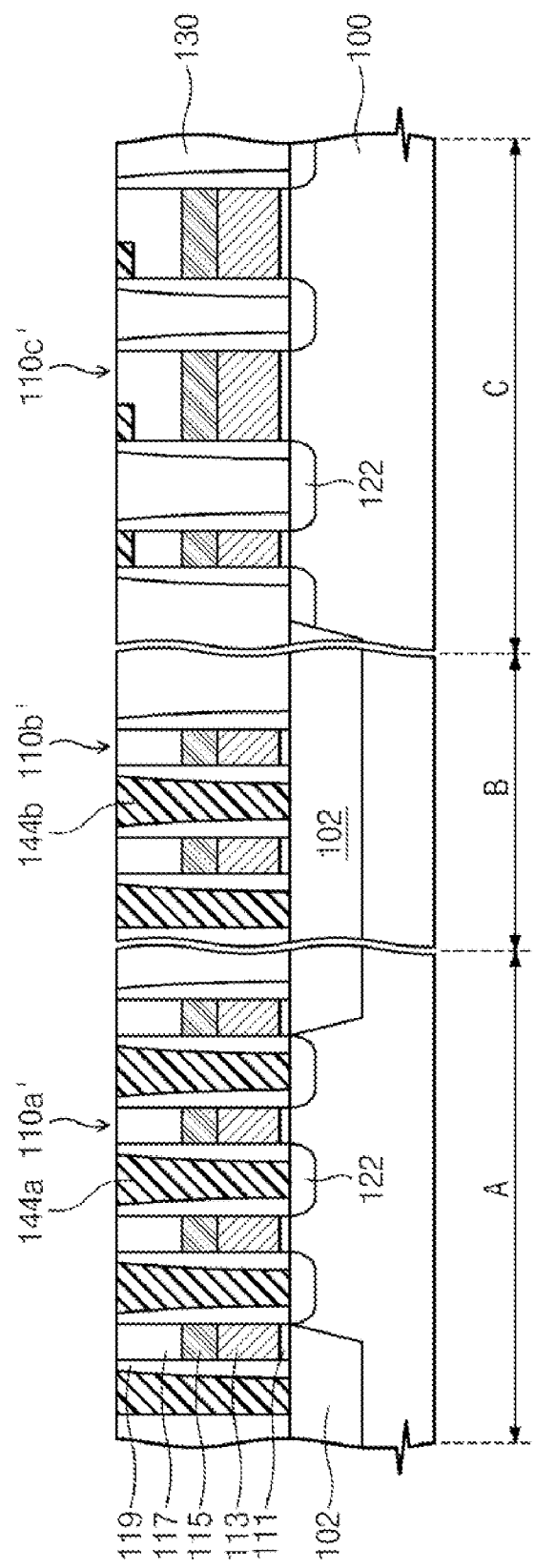
FIGS. 7 through 9 are cross-sectional views illustrating a method for fabricating a semiconductor device according to another embodiment of the inventive concept.
Figure 8:
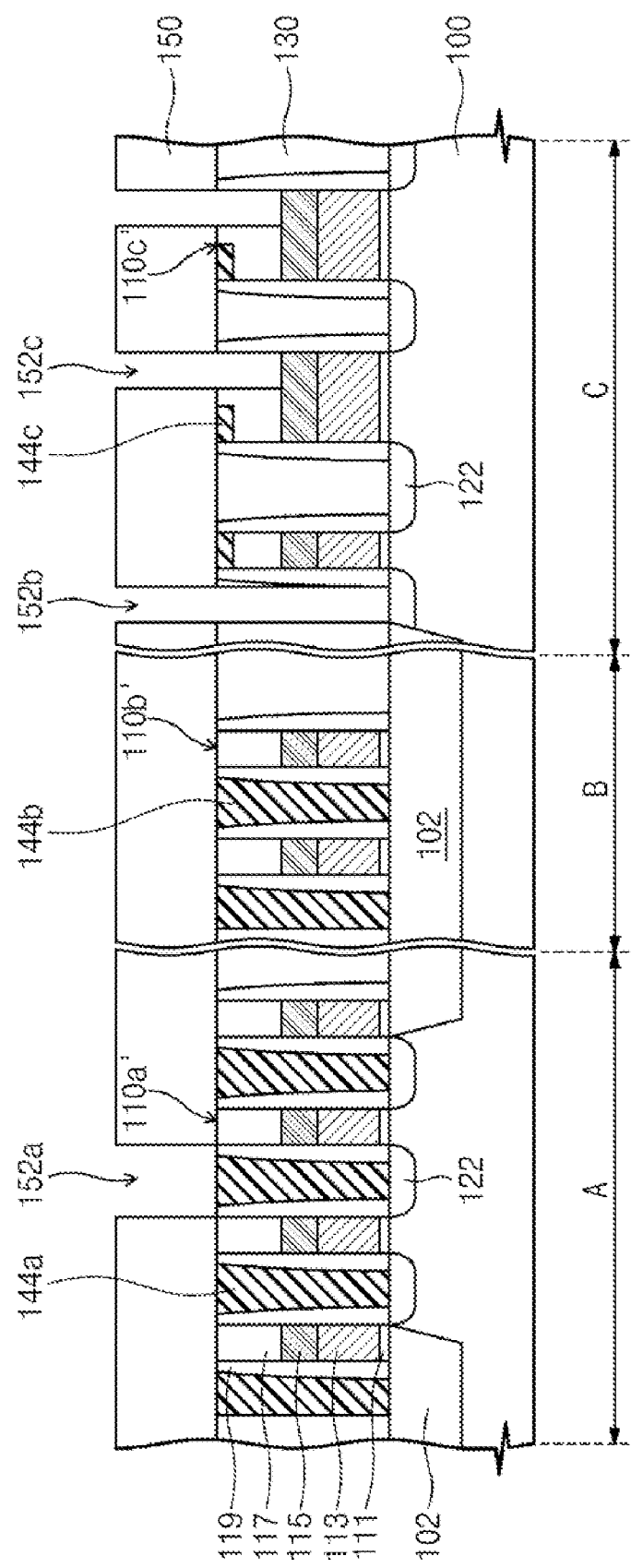
Figure 9:
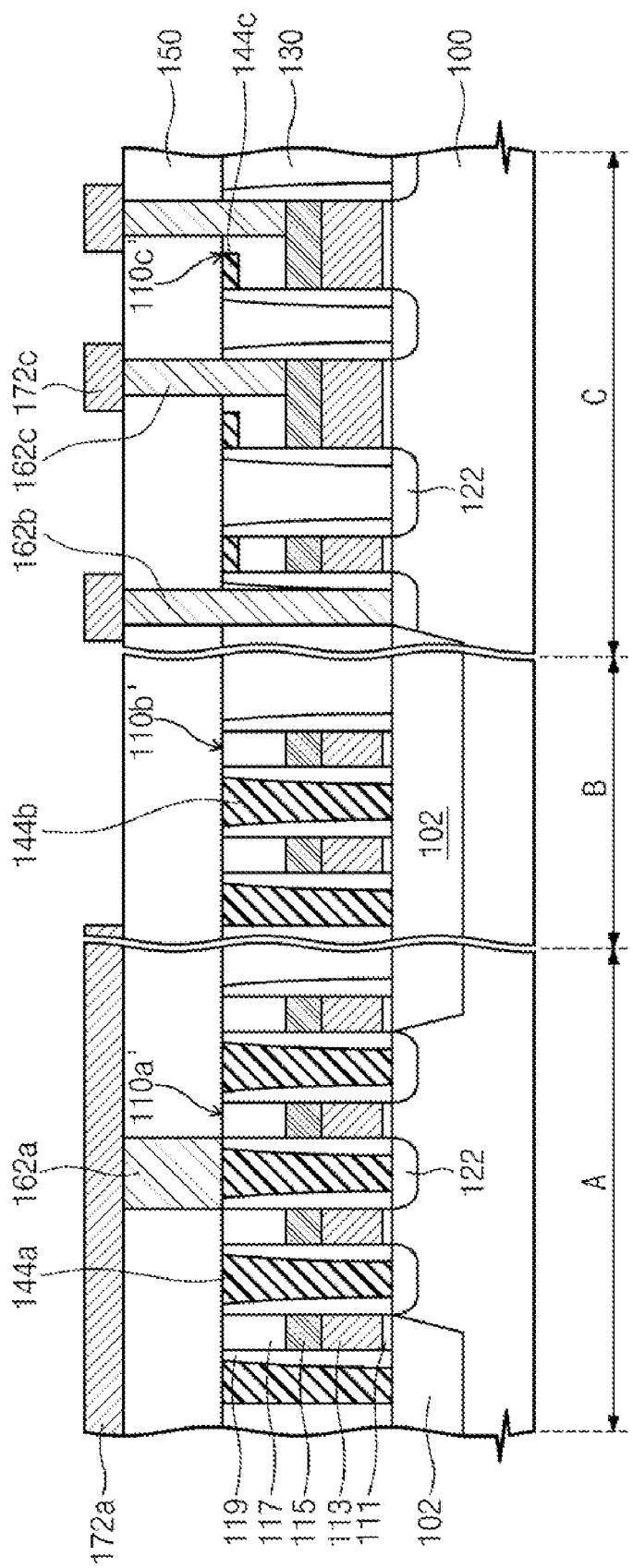
Figure 10:
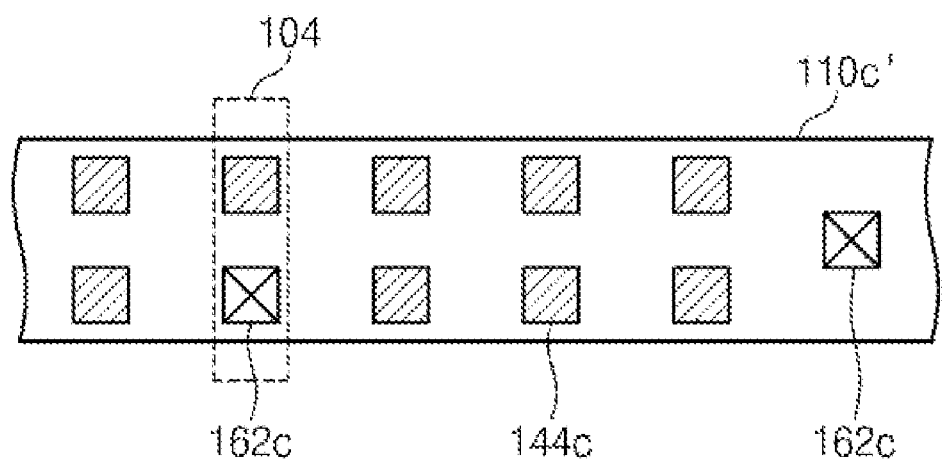
FIG. 10 is a schematic plan view illustrating a peripheral circuit region in another embodiment of the inventive concept.

Hereinafter, a method for fabricating a semiconductor device according to another embodiment of the inventive concept will be described with reference to FIGS. 7 through 10. FIGS. 7 through 9 are cross-sectional views illustrating a method for fabricating a semiconductor device according to another embodiment of the inventive concept. FIG. 10 is a schematic plan view illustrating a peripheral circuit region in another embodiment of the inventive concept.

To avoid an overlapping description with the foregoing embodiment, this embodiment of the inventive concept will be described starting from FIG. 3.

As shown in FIG. 3, after the plug conductive layer 142 is filled in the first and second contact holes 132a, 132b, 132c, a planarizing process is performed with respect to the first interlayer dielectric 130.

Referring to FIG. 7, the planarizing process is performed until the thickness of the first interlayer dielectric 130 in the memory cell region A, the dummy region B and the peripheral circuit region C becomes uniform. Also, the planarizing process is performed until the capping patterns of the all the gate electrodes 110a', 110b', 110c' are exposed. In other words, through the planarizing process, the gate electrodes 110a', 110b', 110c' on the entire surface of the semiconductor substrate 100 may be formed at a uniform height. Further, through the planarizing process, the first and second plug conductive layers 142a, 142b, 142c are electrically separated from one another.

Thus, when the planarizing process is performed, a portion of the second contact plugs 144c may remain in the capping patterns 117 of the gate electrodes 110c' in the peripheral circuit region C.

Referring to FIG. 8, a second interlayer dielectric 150 is formed on the first interlayer dielectric 130 including the gate electrodes 110a', 110b', 110c' and the first and second contact plugs 144a and 144b. Since the second interlayer dielectric 150 is formed on a planarized surface, the second interlayer dielectric 150 may be formed with a uniform thickness.

Thereafter, a photolithography process is performed with respect to the second interlayer dielectric 150 to form third contact holes 152a in the memory cell region A and fourth contact holes 152b, 152c in the peripheral circuit region C. The third contact holes 152a may expose top surfaces of the first contact plugs 144a in the memory cell region A, and the fourth contact holes 152b, 152c may expose the impurity regions 122 and/or the conductive patterns 115 of the gate electrodes 110c' in the peripheral circuit region C.

When the fourth contact holes 152c exposing the conductive pattern 115 of the gate electrode 110c' are formed, since a portion of the second contact plugs 144c remains in the capping pattern 117 of the gate electrode 110c', the fourth contact holes 152c are formed spaced apart from the second contact plugs 144c. If a portion of the second contact plugs 144c were to be exposed when the fourth contact holes 152c are formed, the etch conditions may change. Therefore, the fourth contact holes 152c are formed spaced apart from the second contact plugs 144c.

Referring to FIG. 9, a conductive material is filled in the third and fourth contact holes 152a, 152b, 152c to form third and fourth contact plugs 162a, 162b, 162c. That is, the third contact plugs 162a electrically connected with the first contact plugs 144a may be formed in the memory cell region A, and the fourth contact plugs 162b and 162c electrically connected with the gate electrodes 110c' and/or the impurity regions 122 may be formed in the peripheral circuit region C. Thereafter, interconnections 172a, 172c are connected with the third and fourth contact plugs 162a, 162b, 162c in the peripheral circuit region C.

By forming the fourth contact plugs 162c to be spaced apart from the remaining second contact plugs 144c, an unintentional electrical connection (i.e., short or electrical bridge) between the second contact plug 144c and the fourth contact plug 162c may be prevented.

FIG. 10 shows a position relationship between the second contact plugs 144c and the fourth contact plugs 162c in the peripheral circuit region. Referring to FIG. 10, in the peripheral circuit region, the gate electrode 110c' may be formed crossing an active region 104, and the second contact plugs 144c and the fourth contact plugs 162c may be positioned together on the gate electrode 110c'. Since the gate electrode 110c' in the peripheral circuit region has a wider area than the gate electrode (see 110a' of FIG. 9) in the memory cell region, two or more second contact plugs 144c may be formed on the gate electrode 110c' in the peripheral circuit region. The second contact plugs 144c may be formed at regions other than the regions where the fourth contact plugs 162c are being formed.

Also, although it is shown in FIG. 10 that the second contact plugs 144c and the fourth contact plugs 162c have the same plan view, the second contact plugs 144c and the fourth contact plugs 162c may have different plan views. For example, the second contact plugs 144c may be formed in a line, and may have a wider area than the fourth contact plugs 162c.

In methods for fabricating a semiconductor device according to the embodiments of the inventive concept, a semiconductor device is fabricated such that the area density of the contact plugs in the memory cell region is substantially the same as the area density of the contact plugs in the dummy region and the peripheral circuit region. Accordingly, in the planarizing process of the interlayer dielectric including the contact plugs, different etch rates can be prevented for different respective regions depending on the contact plug density. That is, in the planarizing process, the interlayer dielectric can be uniformly planarized throughout the memory cell region, the dummy region and the peripheral circuit region.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A method for fabricating a semiconductor device, comprising:
   providing a semiconductor substrate including a memory cell region and peripheral circuit regions;
   forming gate electrodes including gate conductive patterns and capping patterns on the memory cell region and the peripheral circuit regions;
   forming an interlayer dielectric covering the gate electrodes;
   patterning the interlayer dielectric to form first contact holes in the memory cell region exposing the semiconductor substrate along side of the gate electrode and second contact holes in the peripheral circuit regions exposing a portion of the capping pattern to space apart a bottom surface of the second contact hole from a top surface of the gate conductive pattern;
   filling a first plug conductive layer in the first contact holes and a second plug conductive layer in the second contact holes; and
   performing a planarizing process to expose the capping patterns to form first contact plugs in the memory cell region and second contact plugs in the peripheral circuit region.

2. The method of claim 1, wherein the planarizing process is performed to expose the capping pattern below the second plug conductive layer and to remove the second contact plugs.

3. The method of claim 1, wherein the planarizing process is performed to expose the capping pattern between a top surface of the capping pattern in the peripheral circuit region and a bottom surface of the second plug conductive layer and to leave a portion of the second plug conductive layer in the capping pattern of the peripheral circuit region.

4. The method of claim 1, after the performing of the planarizing process, further comprising forming a third contact plug in the memory cell region connected with the first contact plug, and fourth contact plugs in the peripheral circuit region contacting the semiconductor substrate and/or the gate conductive pattern at one side of the gate electrode.

5. The method of claim 4, wherein the fourth contact plug is formed at regions spaced apart from the second contact plug.

6. The method of claim 1, wherein the first contact holes expose a portion of the capping pattern of the gate electrode, and the planarizing process separates the first plug conductive layer into the first contact plugs contacting the semiconductor substrate at one side of the gate electrode.

7. The method of claim 1, wherein forming the second contact holes in the peripheral circuit region further comprises exposing the semiconductor substrate at one side of the gate electrode.

8. The method of claim 1, wherein an area density of the first contact holes in the memory cell region is substantially the same as an area density of the second contact holes in the peripheral circuit region.

* * * * *